United States Patent

Koda

[11] 4,032,783
[45] June 28, 1977

[54] PYROELECTRIC RADIATION SENSOR AND IMAGING DEVICE UTILIZING SAME

[75] Inventor: Nobuo John Koda, Vista, Calif.

[73] Assignee: Hughes Aircraft Company, Culver City, Calif.

[22] Filed: May 21, 1976

[21] Appl. No.: 688,666

Related U.S. Application Data

[63] Continuation-in-part of Ser. No. 584,805, June 9, 1975, abandoned.

[52] U.S. Cl. .............................. 250/333; 250/338
[51] Int. Cl.$^2$ ........................................ H01J 31/49
[58] Field of Search .......... 250/338, 339, 340, 330, 250/333

[56] References Cited

UNITED STATES PATENTS 3,898,461    8/1975    Boot .............................. 250/338 X Primary Examiner—Davis L. Willis
Attorney, Agent, or Firm—William J. Bethurum; W. H. MacAllister

[57] ABSTRACT

Disclosed is an infrared radiation (IR) sensor and imaging tube employing same wherein the sensor includes a pyroelectric substrate having a conductive layer of infrared radiation absorbing material on one surface thereof. An electron-emissive metallic grid is disposed on the opposite surface of the pyroelectric substrate and is configured to expose predefined discrete areas of the pyroelectric substrate at which radiation-dependent voltages are developed. These voltages permit the metallic grid to emit electrons in quantity proportional to the infrared radiation received by the radiation absorbing material and the pyroelectric substrate. This IR sensor may advantageously be incorporated in a thermal imaging tube which includes means for flooding the grid surface of the pyroelectric substrate with photons and means for accelerating electrons emitted therefrom to a suitable target, such as a charge coupled device (CCD), a phosphor, a silicon intensified target (SIT), or other suitable electron collector.

11 Claims, 7 Drawing Figures

PYROELECTRIC RADIATION SENSOR AND IMAGING DEVICE UTILIZING SAME

FIELD OF THE INVENTION

This application is a Continuation-In-Part of application Ser. No. 584,805, filed June 9, 1975, now abandoned.

This invention relates generally to thermal imaging devices and more particularly to such devices which are responsive to infrared radiation in the far infrared (6 to 15 micrometers) region of the electromagnetic wavelength spectrum.

BACKGROUND

In the field of infrared imaging, the middle and far infrared region (3–15 micrometers and greater wavelength) of the electromagnetic wavelength spectrum has been of considerable interest to designers of image sensors and the related arts. This is because of the fact that these wavelengths provide relatively large amounts of radiant photon emittance from objects having an average background temperature in the vicinity of 300° Kelvin, or approximately 25° C and the existing atmospheric window in the 3–5 $\mu$m and 8–12 $\mu$m regions. Thus, in order for thermal imaging devices to respond satisfactorily to objects having an average temperature in the general vicinity of 300° Kelvin, the radiation sensitive material of the thermal imaging device must receive sufficient energy from such infrared radiation to properly function as an efficient detector.

There are two significant classes of infrared imagers. One of these is the class of quantum detectors, which includes photocathodes such as the bi-alkyl, tri-alkyl and the III-V compound semiconductors. These quantum detectors are not sufficiently responsive to infrared radiation out beyond about 0.9 micrometers to be useful in the infrared region of the electromagnetic wavelength spectrum of interest. In addition to the above photocathodes, photoconductive and photovoltaic semiconductors are also in this class of quantum detectors, and these latter semiconductors include electronic materials such as indium antimonide (for 3–5 $\mu$m) and mercury cadmium telluride alloy (for 8–12 $\mu$m) which are highly sensitive in the infrared region of the electromagnetic wavelength spectrum. However, because of the relatively narrow band-gaps of these latter materials and the associated problems with dark currents, unless these materials are cooled, it becomes necessary to cool these materials when they are used in infrared imaging systems. The latter requirement results in costly and bulky detector devices.

The second significant class of infrared imagers is the thermal imaging type of detector and includes well-known devices such as thermistors and bolometers which, to my knowledge, have never been utilized in a practical two-dimensional image array. More recently, pyroelectric imagers have been investigated as a low-cost, two-dimensional array suitable for infrared imaging. The relevant prior art in the analogous field of pyroelectric imagers is discussed below.

PRIOR ART

There are two approaches known to me for pyroelectrically sensing far infrared radiation from a remote object and providing a visual image in response thereto. The relative advantages that the present invention has over each of these two prior art approaches will be discussed in some detail below.

The first of these approaches is provided by the so-called pyroelectric vidicon wherein a pyroelectric sensor has one surface thereof oriented toward a radiating object and the opposite surface thereof scanned with an electron beam. This pyroelectric sensor array is electrically connected to an external signal processing circuit which conducts signal current from the sensor array to a suitable television monitor.

The second pyroelectric approach to thermal imaging of long wavelength IR is provided by the so-called electron mirror tube of the type described in an article entitled, "Pyroelectric Thermal Image Tube," *Electronic Letters*, Vol. 10, page 452, Oct. 31, 1974. In this latter device, a pyroelectric sensor array has one surface thereof oriented toward a remote object which radiates infrared radiation, and the opposite surface of the array is flooded with a constant beam of electrons. A chosen electron target is mounted in a predetermined spaced relationship with respect to the source of electrons and the pyroelectric array, so that the flooding electrons are reflected from the sensor array to the target in quantity proportional to the infrared radiation levels received at the array. The number of electrons reflected to the target from each incremental area of the array is dependent upon the open circuit voltage, $V_{oc}$, of each such area, and $V_{oc}$ is, in turn, controlled by the infrared radiation levels received by each such area. During operation, the total surface of the pyroelectric sensor of the electron mirror tube is exposed to the flooding electrons.

ADVANTAGES OF THE INVENTION

The present invention represents a substantial advance in the art of thermal imaging relative to the above pyroelectric vidicon in that, in one form, the present device requires no external video signal processing circuitry for processing the thermal imaging signal derived from the pyroelectric radiation sensor. Additionally, the size, weight and power requirements to drive such video signal processing circuitry for the pyroelectric vidicon have been substantially reduced or eliminated by the present invention.

Finally, relative to the above electron mirror tube, the present invention has eliminated the bulkiness and lack of inherent compactness which are characteristic of the electron mirror tube. Furthermore, contrary to the electron mirror tube, the present invention employs a metallic electron-emissive grid on one surface of the pyroelectric sensor array. This grid enables the application of target transconductance to improve the signal-to-noise ratio in the embodiments of my invention, and no such grid was provided by either the pyroelectric vidicon or the electron mirror tube described above.

THE INVENTION

The general purpose of this invention is, as indicated above, to overcome the above disadvantages associated with the above known prior art thermal imaging devices and systems, while simultaneously providing a lightweight, compact imaging device which is responsive to long wavelength infrared radiation at a relatively high detectivity. To accomplish this purpose as well as to overcome the aforedescribed disadvantage of prior art thermal imaging devices, I have constructed an infrared sensor which includes a pyroelectric substrate upon which a conductive layer of absorbing material is deposited on one surface, and a metallic grid is formed on the opposite surface. The metallic grid exposes predefined discrete areas of the pyroelectric surface, and these areas develop coplanar voltages in response to variations in levels of infrared radiation received by the pyroelectric substrate. These voltages, in turn, control the electron emissivity of the metallic grid which releases free electrons in quantity proportional to received infrared radiation. Advantageously, this infrared sensor may be incorporated in an image tube including means for illuminating the grid surface of the pyroelectric with photon energy sufficient to allow good electron emission from the grid, means for accelerating free electrons away from the grid and electron target means mounted in a predetermined spaced relationship with respect to the grid for providing a visible image or image signal of a remote object from which the infrared radiation is received.

Accordingly, it is an object of the present invention to provide a new and improved pyroelectric image sensor which is highly responsive to infrared radiation for generating electrons at a relatively high detectivity.

Another object is to provide a new and improved imaging device employing such a pyroelectric image sensor in a compact tube design which requires no cryogenic cooling, no scanning mirrors or no other bulky components which have been necessary in the design of far infrared imaging systems.

A further object is to provide a thermal imaging tube of the type described which can be constructed in a relatively small space using lightweight, low-power components.

A further object is to provide a pyroelectric image sensor of the type described which has a relatively high transconductance which may be varied relatively easily by changing the particular array configurations of the electron emissive surface thereof.

A further object is to provide a thermal imaging device of the type described which lends itself to the utilization of various electron targets, such as a charge coupled devices (CCD's), phosphors, silicon intensified targets (SIT's), or other suitable electron responsive target materials.

A further object is to provide a pyroelectric infrared radiation sensor of the type described which is not limited to one specific pyroelectric material in the fabrication thereof.

A further object is to provide a radiation sensor of the type described which is not limited to any specific radiation absorbing or metallic grid materials in the fabrication thereof.

These and other objects and features of the invention will become more readily apparent in the following description of the accompanying drawing wherein:

FIG. 1b is a schematic diagram of the DC biasing arrangement for the device in FIG. 1a.

FIG. 2b is a plan view of the electron emissive grid on the sensor surface of FIG. 2a.

FIG. 2c illustrates the equipotential lines for the sensor in FIG. 2a.

FIG. 2d is a typical transconductance curve for either of the thermal imaging devices of FIGS. 1a and 2a.

Figure 1A:
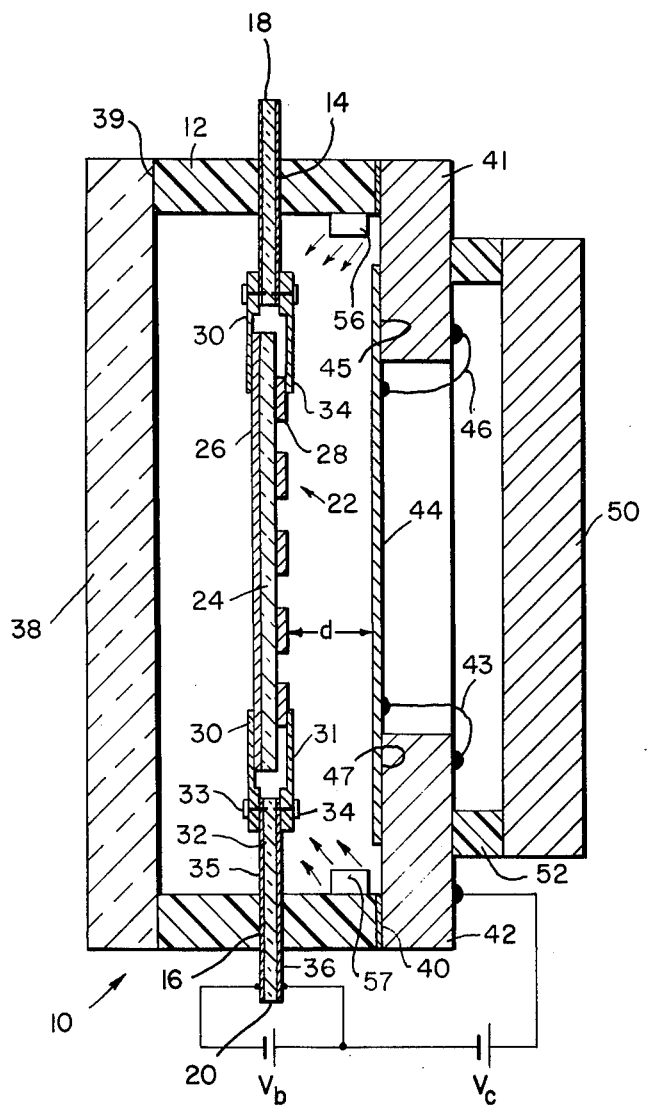
FIG. 1a is a schematic diagram of the thermal imaging device (tube) according to the present invention.

Referring now to FIG. 1, there is shown an imaging device 10 embodying the present invention and including a tube-like housing member 12 having chosen insulating properties. The housing member 12 includes openings 14 and 16 therein through which a pair of electrical connector and support members 18 and 20 extend for physically supporting and providing electrical contact to a pyroelectric infrared image sensor 22. The infrared sensor 22 includes a wafer 24 of a chosen pyroelectric material, such as lithium tantalate (LiTaO$_3$), and the wafer or substrate 24 is coated on one of its major surfaces with a conductive infrared radiation absorbing material 26, such as gold or nichrome. A metallic grid 28 is deposited on the other major surface of the pyroelectric substrate 24 and covers substantially the entire surface of the substrate 24 in the pattern and geometry shown in FIG. 2b below. The exact function of this metallic electron-emissive grid 28 is also described in more detail below.

The pyroelectric substrate 24 is clamped as shown at its outer edges to a pair of L-shaped conductive pieces 30 and 31 which are, in turn, secured to a ceramic substrate 32 by means of a pair of screws 33 and 34. The ceramic substrate has electrical coatings 35 and 36 on the opposite sides thereof which may be advantageously used to connect the supply voltage, $V_b$, between the metallic grid pattern 28 and the conductive IR absorbing film 26.

A suitable infrared window 38, such as germanium, is secured by cement bonding or the like to one end 39 of the housing 12, and this window 38 is chosen to pass infrared radiation in the 3–15 micrometer or greater wavelength range to the infrared absorbing layer 26. The other end 40 of the housing 12 is likewise securely bonded to a pair of metal electrical connectors 41 and 42 for enabling external electrical connections to be made to an electron target member 44.

The electron target member 44 is mounted in close proximity to the metallic grid 28 for the proximity focussed mode of operation, or may be mounted farther away from the grid 28 for the electron focussed mode of operation. The focus-lens system is not shown in FIG. 1 for the latter mode of operation, but the selection and construction of such focus-lens system is clearly within the skill of the art. The target member 44 is securely bonded using conventional bonding techniques to the inside faces 45 and 47 of the electrical connectors 41 and 42 respectively and is positioned a predetermined distance $d$ from the metallic grid 28 of the pyroelectric infrared sensor 22. As noted below, the electron target member 44 may advantageously be a charge coupled device (CCD), a phosphor or a silicon intensified target (SIT), which are operative to generate a visible image or image signal in response to electrons received from the pyroelectric infrared sensor 22. It should be noted that in case of CCD and SIT targets, electron bombardment charge gain can be obtained. A plurality of electrical connections 46 and 43 may be made from the back or exterior surface of the electron target member 44 to the electrical connectors 41 and 42 in order to provide the necessary DC operating bias to the electron target member 44.

The above image device structure 10 is completed by the addition of a vacuum cover 50 which is bonded as shown to a continuous ring-like sealing member 52 positioned between the edges of the cover 50 and the outside faces of the electrical connectors 41 and 42.

Advantageously, one or more light (photon) sources 56 and 57 are secured as shown to the inside wall of the housing member 12, and these sources may, for example, be light emitting diodes (LED's), gas lamps or incandescent lamps which are useful to apply a constant source of photon energy to the photosensitive grid surface of the pyroelectric substrate 24. This energy frees electrons from the metal grid 28 for acceleration to the surface of the electron target member 44. The varying number of electrons freed by the metallic grid 28 are proportional to the coplanar pyroelectric voltages adjacent to the grid 28.

A suitable photocathode metal which may be used in fabricating the grid 28 (using conventional state-of-the-art metal deposition and masking techniques) is type S4 cesium antimonide, $Sb_2Cs_3$. Additionally, the type S1 cesium-oxygen-silver photocathode material may be used to form the metal grid 28, and all of the above identified types of photocathode materials have been developed, or are available, in-house by the Applicant's assignee, the Hughes Aircraft Company, of Culver City, California. In forming a cesium antimonide grid, antimony may be vapor deposited on the pyroelectric substrate 24 while selected amounts of cesium are added to the antimony vapors at an elevated temperature on the order of 150° C.

Figure 1B:
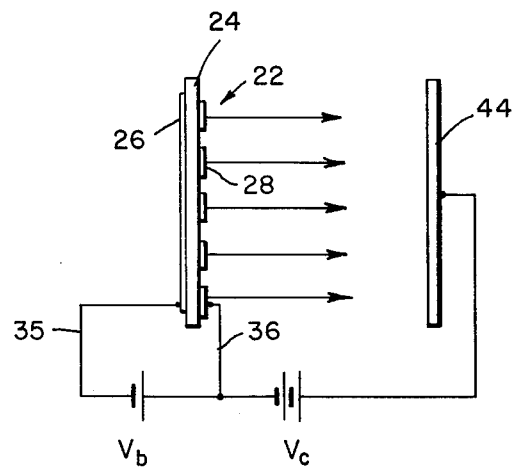

Referring now to FIG. 1b, there is shown one DC biasing arrangement useful to provide both a DC supply voltage, $V_b$, directly across the pyroelectric substrate 24 as well as the electron accelerating voltage, $V_c$, between the metallic grid 28 and the electron target member 44. The positive potential of the supply voltage, $V_b$, is applied to the entire grid pattern 28, so that the entire pyroelectric substrate 24 is charged, − to + from left to right as viewed in FIG. 1b. The supply voltages $V_b$ and $V_c$ may be connected to the pyroelectric sensor 22 and to the electron target member 44 by means of the previously described electrical connections 30, 31, 35 and 36 illustrated in FIG. 1a. The electron accelerating voltage $V_c$ may be varied, of course, to control the level of the accelerating field between the grid 28 and the electron target 44.

Figure 2B:
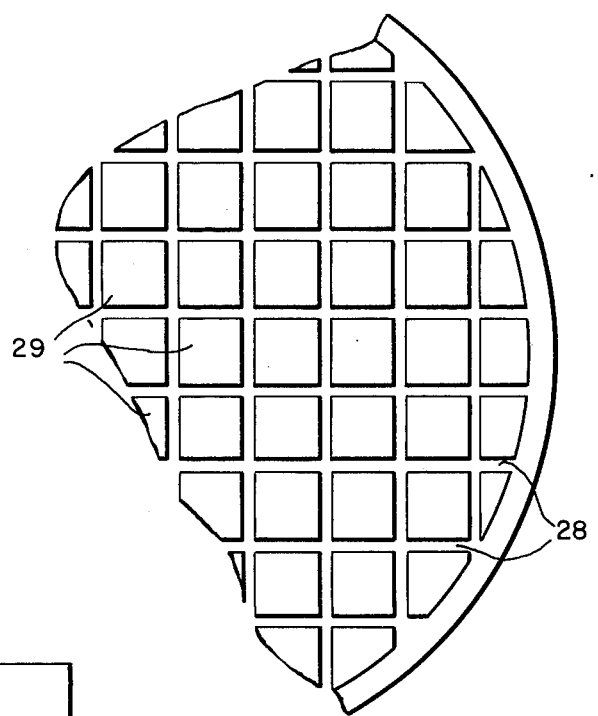
Figure 2A:
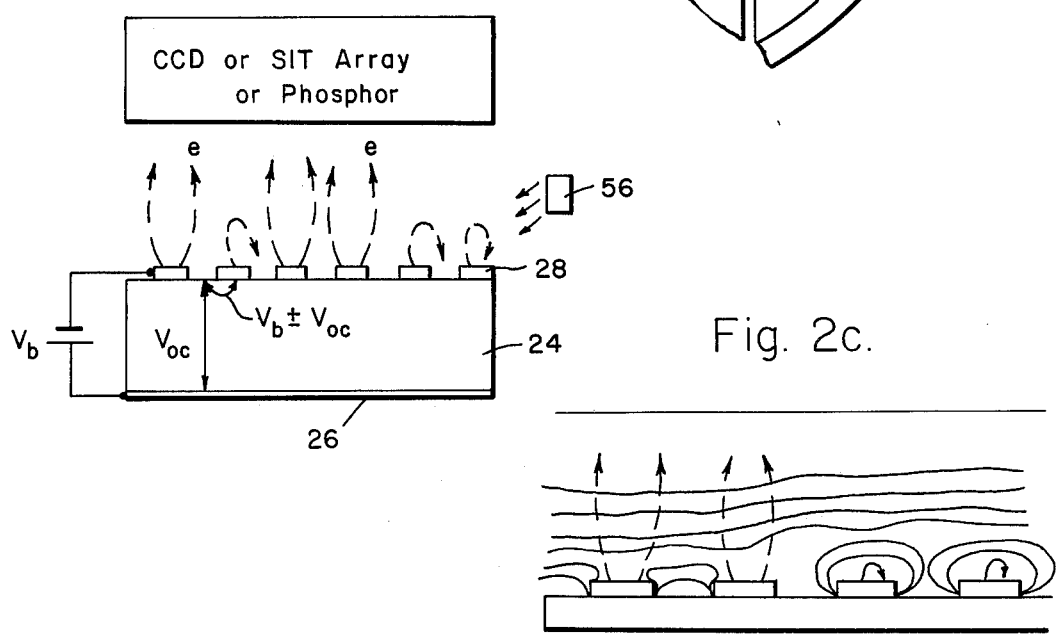
FIG. 2a illustrates electrons leaving a pyroelectric sensor to impinge on a chosen electron target for generating either a visual image or image signal.

Referring now to FIGS. 2a through 2d, in a preferred embodiment of the invention, the pyroelectric substrate 24 is a polarized wafer of lithium tantalate ($LiTaO_3$) having a conductive layer 26 of gold on one major surface and a photoemissive conductive grid 28 of cesiated antimony on the opposite major surface. The illuminator 56 is mounted as shown within the housing member 12 and illuminates the photoemissive metallic grid 28, and the electron collector or target 44 is positioned to receive the electrons emitted from the photoemissive conductive grid 28. In operation, the potential $V_b$ in FIG. 1b is set so that photoemission from the grid 28 is just cut off by the coplanar grid effect. Another method to achieve the cutoff potential is by applying a negative pulse train on the input conductive electrode relative to the metallic grid. By capacitive coupling, a negative potential becomes applied in the grid cells of the photoemissive grid. That is, the negative potential on the input conductive surface of the pyroelectric substrate 24, which is coupled to the areas of the substrate 24 between the grid lines 28, is sufficient to neutralize the positive field gradient in front of the photoemissive grid 28. Thus, when an infrared radiating object is focused on the pyroelectric wafer 24, a less negative potential is generated by the photoelectric effect in the spaces of the substrate 24 between the grid lines 28. This reestablishes a positive field gradient above the surface of the metallic grid 28 and causes photoelectrons to escape from the grid lines 28, as shown in FIG. 2a, in quantity proportional (within transconductance limits) to the levels of incoming infrared radiation recieved by the pyroelectric wafer 24. The emitted electrons are then focused and accelerated to the electron target 44, which may be a phosphor, a charge coupled device, or a silicon intensified target.

If the electron target 44 is a phosphor, then of course the image of the infrared radiating object can be directly viewed on the surface of the phosphor target 44. On the other hand, where the electron target 44 is a silicon wafer, the electrons must bombard the wafer with sufficiently high energy to create a plurality of charge carriers therein for each impinging electron. The silicon target 44 may be constructed as either a silicon intensified target (SIT) or a charge-coupled device (COD), and in either of these devices a gain in the incoming IR signal is achieved by the creation of a plurality of charge carriers for each electron impinging the target surface. In both the SIT and CCD targets, the multiplied carriers in the silicon diffuse to the opposite surface of the target 44 where they are read out by known state-of-the-art signal processing techniques.

In the SIT target, carriers in the silicon will discharge an array of PN junction diodes (not shown) on the opposite surface of the target 44, and when these diodes are recharged by a scanning electron beam, the charging signal is read out from the silicon wafer. One such read-out technique is described, for example, in the Wendland U.S. Pat. No. 3,423,623, directed to a silicon vidicon.

Using a charge-coupled device target, the charge carriers produced by electron bombardment and which diffuse toward the opposite surface of the target are stored in discrete potential wells (not shown) created by predetermined potentials which are applied to gate lines (not shown) of the charge-coupled device array. By using state-of-the-art CCD gate pulsing techniques, these stored charges can be read out in the proper sequence to the output electrodes of the CCD provide the image signal which can then be coupled to a TV monitor for translation to a visible image.

Figure 2C:
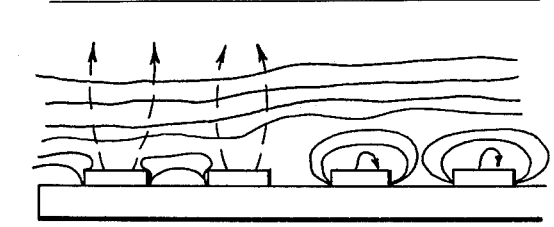
Figure 2D:
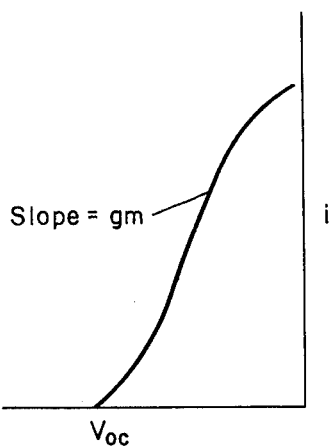

Referring now to FIG. 2b, there is shown the circular surface geometry of the pattern for the metallic grid lines 28, and FIG. 2c illustrates the equal potential lines at various distances from the conductive grid 28 in the direction of the surface of the electron target 44. In FIG. 2c it is seen that an absence or partial absence of IR energy beneath the two right-hand grid lines leaves the equipotential lines over these grid lines unaltered, and as such the electric field defined by these lines prevents electrons from leaving these two right-hand grid lines and being accelerated to the target 44. On the other hand, the IR dependent surface potential $V_b \pm V_{oc}$ (FIG. 2a) adjacent the two left-hand grid lines in FIG. 2c do alter the contour of the equipotential lines surrounding these two grid lines. This permits electrons to escape from these two left-hand grid lines in quantity proportional to $V_b \pm V_{oc}$. The transconductance curve in FIG. 2d is a plot of the variation in electron current, $i$, with changes in the open circuit voltage, $V_{oc}$, between adjacent grid lines of the previously defined metallic grid 28.

Figure 3:
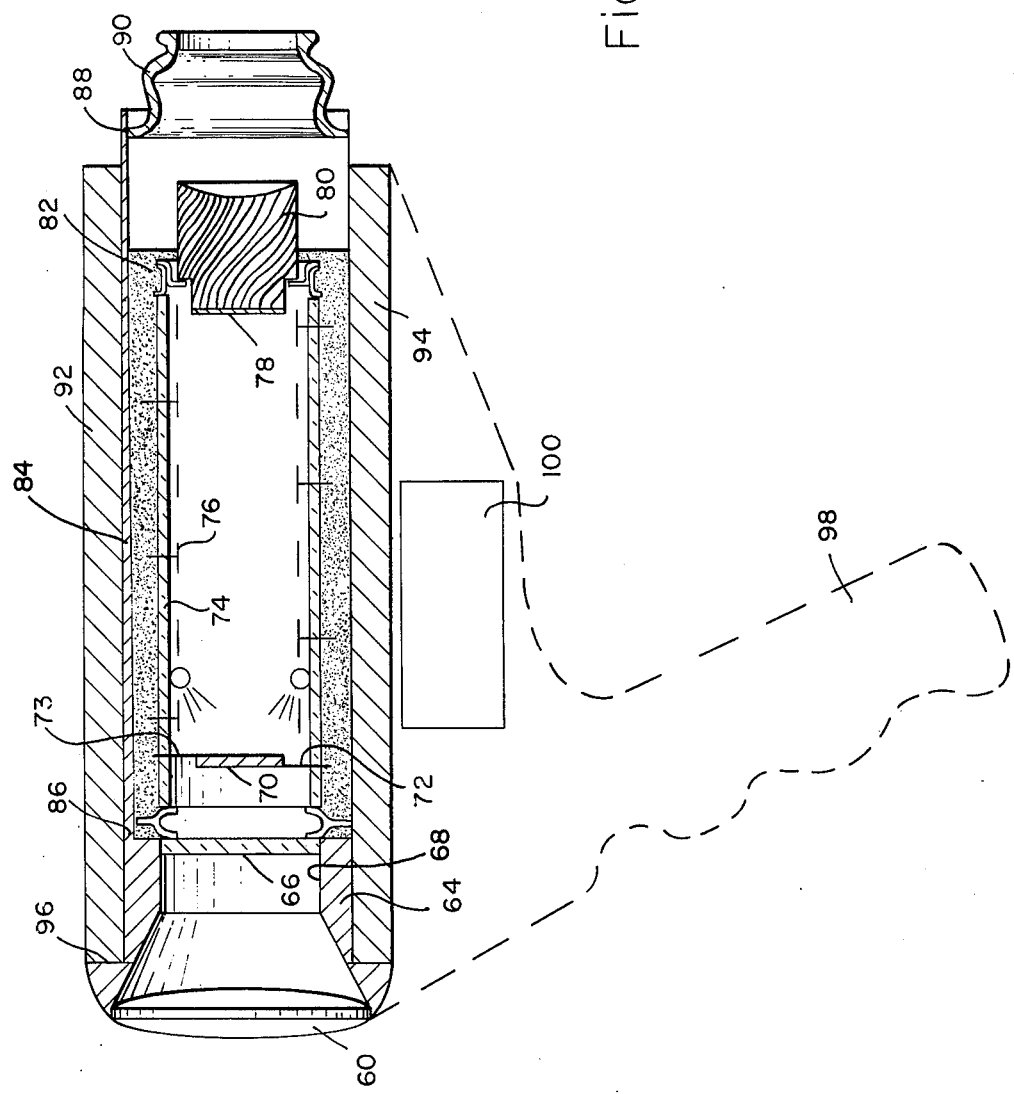
FIG. 3 is a schematic diagram, partly in cross-section, of a complete imaging device (tube) of the invention including handle, case, power supply and the necessary electric and magnetic field electron acceleration and control components.

Referring now to FIG. 3, there is shown a useful hand-held infrared imager which incorporates the teachings and principles of the present invention. This hand-held imaging device includes an infrared viewing lens 60 mounted as shown in an insulating housing member 64 in the left-hand end of the device as viewed in FIG. 3. This infrared lens 60 establishes the optical field of view for this device, and a thin disc-like infrared window 66 is mounted within an opening 68 of the housing member 64 and spaced a predetermined distance from IR lens 60. The IR window 66 corresponds, of course, to the IR window 38 in FIG. 1a, whereas the pyroelectric sensor 70 in FIG. 3 corresponds to the pyroelectric sensor 22 previously defined in FIG. 1a. The sensor 70 is supported by means of electrical connectors 72 and 73 which individually represent the interconnect components 30–36 in FIG. 1a and are mounted as shown in the walls of the elongated tube housing 74. The tube housing 74 also supports spaced electron accelerating electrodes 76 which are connected to a suitable electric and magnetic field for controlling the velocity and direction of electrons which leave the grid of the sensor 70 and impinge on the target surface 78 of a phosphor 80.

The elongated tube housing member 74 is preferably surrounded by a suitable potting compound 82, which in turn is packaged in a cylindrical metal shield 84 extending from one edge 86 of the lens housing 64 to the mouth 88 of an eye boot 90. Further, the cylindrical metal shield 84 is surrounded by magnets 92 and 94 which provide the focus field for electrons leaving the sensor 70 and arriving at the target surface 78 of the phosphor 80. The magnets 92 and 94 may be bonded or otherwise firmly secured directly to the shield 84, and these magnets 92 and 94 form fit into the cut out section 96 of the lens housing 64.

To complete the above described device, a handle and associated casing 98 may be attached to the lower magnet 96 as shown in FIG. 3 using state-of-the-art packaging techniques, and advantageously, a power supply 100 may be inserted directly into a portion of the handle and associated casing 98 as shown. It is to be understood, of course, that FIG. 3 is only a schematic diagram to illustrate the general arrangement of the pyroelectric sensor 70, target 80 and the other lens, window, electrode, and other associated components, without attempting to specify all of the fabrication details for building such a hand-held imaging device. Obviously, one could obtain such manufacturing details from image intensifier manufacturers.

CALCULATED DEVICE PERFORMANCE

In calculating the performance of the device of FIG. 3, specific values for the essential parameters have been used. These values are based on data reasonably well proven in vacuum tube imaging and in pyroelectric work. The pyroelectric wafer used in my tests was 1.6 cm² in area and contained about 5500 elements. Therefore, calculating the sensitivity on a per element basis and substituting the following values, we have:

$$i_p = g_m \cdot R_s \cdot P \cdot A \cdot dT/dt \qquad \text{Eq. 1}$$

where $i_p$ = resultant photoemission signal current with .1 sec image integration time.

$g_m = 2\times 10^{-11}$ mhos transconductance of the device based on 10 footcandle illumination, 67 $\mu$a 1m$^{-1}$ photoemitter efficiency and a 3 volt transfer characteristic.

$R_s = 2.4 \times 10^{12}$ ohms, the surface resistivity of each element based on measured charge decay rate.

$P = 2\times 10^{-8}$ coul °C$^{-1}$ cm$^{-2}$, the pyroelectric coefficient of LiTaO$_3$.

$A = 1.5 \times 10^{-4}$ cm², the area of each element.

$dT/dt$, the incremental temperature change rate of the pyroelectric sensor when irradiated by the object viewed, $= 2.27 \times 10^{-4}$ °C s$^{-1}$, based on F/1.5 optics of 50% transmission, target thickness of 100 $\mu$m, 0.1 scene temperature difference (300° K background).

This gives a signal current $$i_p = 3.3 \times 10^{-14} \text{ amps.} \qquad \text{Eq. 2}$$

The resultant change in phosphor brightness is given by:

$$B = ip/A \cdot V_{ph} \cdot Z_{ph} = B = ip/A \cdot V_{ph} \cdot Z_{ph} \qquad \text{Eq. 3}$$

where $V_{ph} = 7$ kv, the effective phosphor voltage $Z_{ph} = 67$ lumen w$^{-1}$, the phosphor efficiency.

Then $B = 0.1$ foot lamberts.

This image brightness is typical of state-of-the-art image intensifers used for night vision purposes; however, the background for these state-of-the-art devices is less than 1% of this value of B. In the case of the pyroemissive imager of the present invention, a higher background will probably occur due to the requirement that the tube be operated at optimal transconductance, although initial data on gm values in the region of 1% of maximum photoemission look encouraging. A compromise operating condition may be necessary, whereby a minimal constant background illumination and maximum transconductance is achieved.

The transconductance of the device is dependent on the electrode geometry and the photoemission. Not only should the photoemission be maximized but, for sharp cutoff characteristics, the energy spread should be minimal. Maximizing the emission requires a high efficiency surface as well as sufficient illumination; the best combination to do this is through the use of narrow band illuminators such as low pressure mercury lamps in conjunction with S-4 photocathodes. In the case of the electrical output imager, the possibility exists for operating at the steepest part of the transconductance curve if the constant current part of the output signal is subtracted out by a dc offset.

SIGNAL-TO-NOISE RATIO

The noise limited sensitivity is determined by the photoelectron shot noise and the Johnson noise associated with the surface impedance $R_s$. These are as follows:

The shot noise $$i_h = (2ei\Delta f)^{1/2}$$

and the Johnson noise $$i_{n\,j} = g_m (4KTR\Delta f)^{1/2}$$

Where $e = 1.6 \times 10^{-19}$ couls, electron charge
$i = 3.6 \ 10^{-11}$ amps, the maximum permissible photoemission
$\Delta f = 10$ HZ, the bandwidth
$K = 1.38 \times 10^{-23}$ watt sec°C$^{-1}$, Boltzmann's constant
$T = 300°$ K, ambient temperature.
The resultant noise figure is given by:

$$(i_h{}^2 + i_j{}^2)^{1/2} = 1.66 \times 10^{-14} \text{ amps.}$$

Thus, for a 0.1° C object temperature change using F/1.5 optics, the signal-to-noise ratio will be:

$$S/N = ip/(i_h{}^2 + i_j{}^2)^{1/2}$$

from above:

$$S/N \simeq 2$$

Thus, there has been described a pyroemissive direct view imaging device for the far infrared region of the electromagnetic wavelength spectrum. This device has all of the advantages of compactness and light weight and does not require cryogenic cooling or scanning mirrors. It will be understood, of course, that the present invention is not limited to a particular type of electron target 80 and may utilize charge coupled device (CCD) type targets, silicon intensified target (SIT) vidicons or other possible electron targets yet to be developed. Furthermore, as noted specifically above, the invention in its broadest scope is not limited to any of the electronic materials used in the pyroelectric substrate 24, the IR absorbing layer 26 or the electron emissive grid 28.

Finally, it should be noted that the operation of the invention is not specifically limited to a particular wavelength range of infrared radiation. The 3–15 micrometer range is specified above because it is generally considered to define the middle and far IR band of practical interest to the thermal imager designer because of known transmission windows and characteristics of the IR transmission spectrum. However, the above embodiments of the invention are quite capable of responding to near IR radiation down to about one micrometer wavelength and out to IR radiation wavelengths greatly in excess of 15 micrometers.

What is claimed is:

1. In combination, an infrared sensor including:
   a. a pyroelectric substrate having first and second major surfaces,
   b. a layer of conductive infrared radiation absorbing material on said first major surface, and
   c. a metallic grid including discrete grid lines disposed on said second major surface and exposing predefined discrete areas of said second major surface, whereby upon the application of a predetermined bias voltage between said layer of conductive material and said grid and the receipt of both predetermined constant photon energy by said second major surface and infrared radiation by said first major surface, said substrate develops open circuit voltages between discrete lines of said metallic grid which alter the electric field patterns adjacent said grid and, in turn, control the quantity of photo-electrons released from said grid and available for acceleration to a remote target.

2. The sensor defined in claim 1 wherein said pyroelectric substrate is comprised of a wafer of lithium tantalate, LiTaO$_3$.

3. The sensor defined in claim 2 wherein said layer of conductive material is gold and said metallic grid is cesiated antimony.

4. In combination, a pyroelectric imaging device including:
   a. a pyroelectric substrate having first and second major surfaces,
   b. a conductive layer of infrared radiation absorbing material on said first major surface,
   c. a metallic grid disposed on said second major surface and exposing predefined discrete areas of said second major surface,
   d. means for illuminating the exposed areas of said second major surface with a preselected source of photon energy necessary to free electrons from said grid,
   e. means for accelerating free electrons away from said metallic grid, and
   f. electron target means mounted in a predetermined spaced relationship with respect to said metallic grid and said accelerating means for producing a visible image or an image signal which is dependent upon the pattern and quantity of electrons received from said metallic grid.

5. The combination defined in claim 4 wherein said pyroelectric substrate is comprised of a wafer of lithium tantalate, LiTaO$_3$.

6. The combination defined in claim 5 wherein said layer of conductive material is gold and said metallic grid is cesiated antimony.

7. An infrared sensor comprising:
   a. a pyroelectric substrate having first and second major surfaces,
   b. a conductive layer on said first major surface for applying a potential thereto and also for absorbing received infrared radiation, and
   c. an electron emissive metallic grid disposed on said second major surface for emitting electrons in response to predetermined photon energy and adjacent electric field patterns in quantity proportional to levels of infrared radiation received by said pyroelectric substrate.

8. The sensor defined in claim 7 wherein:
   a. said pyroelectric substrate is lithium tantalate, LiTaO$_3$,
   b. said conductive layer is gold, and
   c. said metallic grid is cesiated antimony.

9. In combination, the sensor defined in claim 7 and further including:
   a. means for illuminating the exposed areas of said second major surface with a preselected source of photon energy necessary to free electrons from said grid,
   b. means for accelerating free electrons away from said metallic grid, and
   c. electron target means mounted in a predetermined spaced relationship with respect to said metallic grid and said accelerating means for producing a visible image or an image signal which is dependent upon the pattern and quantity of electrons received from said metallic grid.

10. The combination defined in claim 9 wherein said pyroelectric substrate is comprised of a wafer of lithium tantalate, LiTaO$_3$.

11. The combination defined in claim 10 wherein said layer of conductive material is gold and said metallic grid is cesiated antimony.

* * * * *